United States Patent
Miller et al.

[11] Patent Number: 5,866,306
[45] Date of Patent: Feb. 2, 1999

[54] PROCESS FOR USE OF PHOTOSENSITIVE POLYSILANES AS PHOTORESIST

[75] Inventors: Robert Dennis Miller, San Jose; Gregory Michael Wallraff, Morgan Hill; Mark Edwin Baier, Sonora, all of Calif.

[73] Assignee: International Business Machines Corporation, Armonk, N.Y.

[21] Appl. No.: 78,808

[22] Filed: Jun. 17, 1993

Related U.S. Application Data

[63] Continuation of Ser. No. 981,903, Nov. 23, 1992, abandoned, which is a continuation of Ser. No. 664,259, Mar. 4, 1991, abandoned.

[51] Int. Cl.⁶ ................................................ G03F 7/039
[52] U.S. Cl. ........................................ 430/376; 430/270.1
[58] Field of Search ................................ 430/326, 315, 430/270, 18, 270.1; 428/195

[56] References Cited

U.S. PATENT DOCUMENTS

| | | | |
|---|---|---|---|
| 3,163,534 | 12/1964 | Adams et al. | 96/75 |
| 4,587,205 | 5/1986 | Harrah et al. | 430/326 |
| 4,822,716 | 4/1989 | Onishi et al. | 430/270 |
| 4,871,646 | 10/1989 | Hayase et al. | 430/270 |
| 5,204,226 | 4/1993 | Baier et al. | 430/270 |

FOREIGN PATENT DOCUMENTS

| | | |
|---|---|---|
| 0130338 | 5/1984 | European Pat. Off. |
| 2156834 | 4/1984 | United Kingdom |

OTHER PUBLICATIONS

Miller, et al., "Polysilanes: Solution Photochemistry and Deep–UV Lithography", ACS Sympos. Series No. 412 1989, 115.

Miller, et al., "Soluble Polysilanes: An Interesting New Class of Radiation Sensitive Materials", Polymer Eng. and Sci., 1986, vol. 26, No. 16.

Miller, et al., "Polysilane High Polymers", American Chemical Society, 1989.

Diaz, et al., "Electrooxidation of Substituted Silane High Polymers", (Res. Lab. IBM San Jose, CA) Chem. Abs. 103:88297f, 1985.

Taylor, et al., "Lithographic Photochemical and Oxygen RIE Properties of Three Polysilane Copolymers", Chem. Abs. 110:182759Z, 1989.

Hayase, et al., "Polysilane Compound, and Bilayer Photoresist Containing It", Chem. Abs. 111:31346G.

Miller, Chem. Abs. 112:12888/M, 1990.

Ito, et al., "Photosensitive Resin Compositions for Fine Patterning", Chem. Abs. 113:32000t, 1990.

Rosilio et al., "Contribution to the Study of Polysilanes for Photolithography", Microelectonic Engineering 6 (1987) 399–406.

Hitachi et al., "Radiosensitive and Photosensitive Organic Polymeric Material", vol. 7, No. 274 (P–241) (1419), Dec. 7, 1983.

*Primary Examiner*—Christopher D. Rodee
*Attorney, Agent, or Firm*—Robert B. Martin

[57] ABSTRACT

The present invention relates to the use of certain polyalkylphenyl silanes in photoresists to generate positive tone resist images. The polyalkylphenyl silanes have the formula:

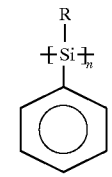

where R is C2–C12 alkyl and n is about 150 to 7000.

6 Claims, 1 Drawing Sheet

PROCESS FOR USE OF PHOTOSENSITIVE POLYSILANES AS PHOTORESIST

This is a continuation of application Ser. No. 07/981,903 filed on Nov. 23, 1992, now abandoned, which is a continuation of application Ser. No. 07/664,259 filed on Mar. 4, 1991 abandoned.

FIELD OF THE INVENTION

The present invention relates to a process for the use of photosensitive polysilanes as photoresist in the manufacture of integrated circuits.

BACKGROUND OF THE INVENTION

There is a desire in the industry for higher circuit density in microelectronic devices made using lithographic techniques. One method of achieving higher area density is to improve resolution of circuit patterns in resist films. The use of shorter wavelength radiation (e.g. deep UV-220 to 280 nm) than the currently employed near and mid-UV spectral range (300 nm to 450 nm) offers the potential for improved resolution. However, with deep UV radiation, fewer photons are transfered for the same energy dose to achieve the same desired photochemical response. Further, current lithographic tools have greatly attenuated output in the deep UV spectral region. Therefore, there is a need in the art to develop resist materials which are more sensitive to radiation in deep UV.

Poly(bisalkyl)silanes and poly(methylphenyl)silane are known in the art for use as a resist e.g. in making bilayer photoresist, Miller et al., Materials for Microlithography, ACS Symposium Series 266, page 293, 1984. The bilayer resist comprises an imaging, oxygen plasma resistant polysilane layer over a planarizing polymer layer coated on a substrate. When the resist is imaged, the radiation causes photochemical degradation of the exposed polysilane into lower molecular weight material. Photochemical degradation is accompanied by a proportional amount of spectral bleaching which is used in the art to measure the degree of degradation. The degradation of the exposed polysilane enables wet development of a positive image with common organic solvents. The image is then transferred through the underlying polymer layer to the substrate by oxygen plasma development. However, current polysilanes lack sensitivity and require large radiation doses of 100 to 400 millijoules/cm$^2$ for suitable imaging and therefore are generally less desirable for commercial use especially in deep UV. It is therefore an object of the present invention to provide improved photosensitive polysilanes for use as photoresist.

Other objects and advantages will become apparent from the following disclosure.

SUMMARY OF THE INVENTION

The present invention relates to a a process for using photosensitive poly($C_2$–$C_{12}$ alkylphenyl)silanes in a photoresist to generate positive tone images. The present invention also relates to an integrated circuit made by the process of the present invention.

A more thorough disclosure of the present invention is presented in the detailed description which follows and from the accompanying drawing in which FIG. 1 is a graph of sensitivity contrast curves.

DETAILED DESCRIPTION OF THE INVENTION

Figure 1:
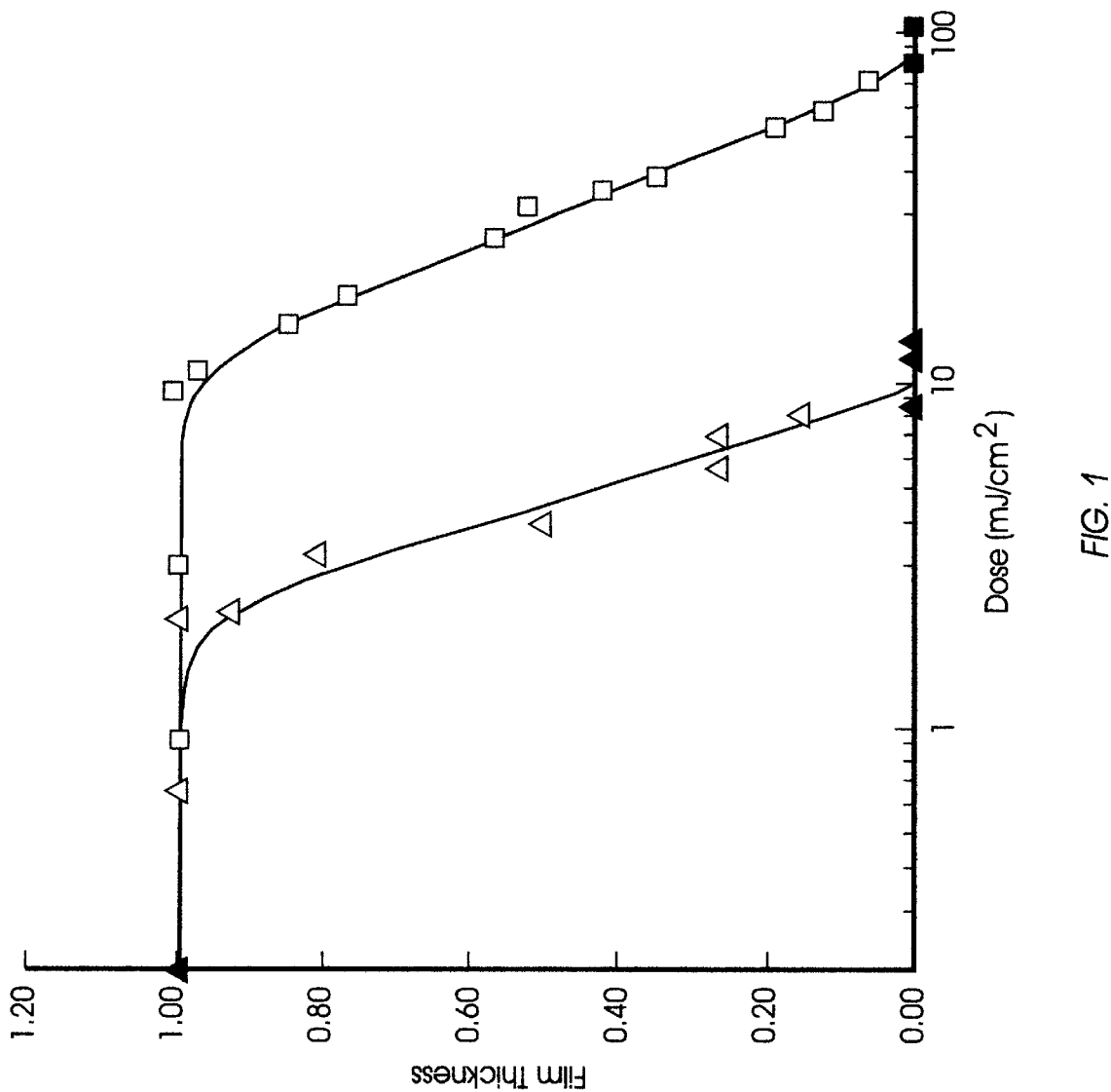

The present invention relates to a process for generating positive tone images in a film of poly($C_2$–$C_{12}$ alkylphenyl) silane comprising the steps of (a) forming a film comprising poly($C_2$–$C_{12}$ alklylphenyl)silane; (b) imagewise exposing the film to radiation and (c) developing the image by art known techniques such as by treatment with an organic solvent. The film can be coated directly onto a substrate or more preferably as a top layer of a bilayer resist.

Suitable poly($C_2$–$C_{12}$ alkylphenyl)silanes for use in the process of the present invention have the formula:

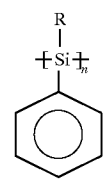

where R is C2–C12 alkyl and n is about 150 to 7000. Preferred poly($C_2$–$C_{12}$ alkylphenyl)silanes are poly (lower alkyl ($C_2$–$C_8$) phenyl) silanes where the alkyl substituent is linear, branched or cyclic such as ethyl, propyl, butyl, hexyl or the like. The alkyl and phenyl substituent of the polysilane can be each independently substituted with one or more of a variety of substituents such as alkyl, alkoxy, alkylamino, or alkoxyalkyl. Other suitable substitutents which do not interfere with the photodegradation of the polysilane and do not effect the desired properties of the polysilane will be known to those skilled in the art.

Preferred poly(lower alkyl phenyl) silanes include poly (ethyl phenyl) silane, poly (ethyl p-tertbutylphenyl) silane, poly (hexyl phenyl) silane and poly (ethyl-p-methoxyphenyl) silane.

The polymer can be conveniently prepared by admixing at an elevated temperature the corresponding alkyl phenyldichlorosilane monomer in a suitable solvent such as toluene with sodium dispersed in toluene. The addition of diglyme or crown ethers may increase reaction yield but also lowers the molecular weight of the polymer. Suitable molecular weights for the polysilane are about 30,000 to 3,000,000. Polymers having a glass transition temperature above room temperature are preferred for ease of processing and a higher temperature for dimensional stability during oxygen plasma development.

The poly($C_2$–$C_{12}$ alkylphenyl)silane used in the process of the present invention may optionally be admixed with 3 to 12 mole % of photosensitizers such as 1,4-bis (trichloromethyl) benzene, 1,3,5-tris (trichloromethyl) triazine, N-(methylphenylsulfonoxy) phthalimide or N-(trifluoromethylsulfonoxy) phthalimide. Other sensitizers for use with polysilane in the process of the present invention will be known to those skilled in the art.

The poly($C_2$–$C_{12}$ alkylphenyl)silane for use in the process of the present invention can be a copolymer formed with $C_2$–$C_{12}$ alkylphenylsilylene and other silylene units such as bis-alkylsilylene and processes utilizing such copolymers are contemplated as equivalents of the the process claimed herein.

The first step of the process of the present invention involves forming the film of poly($C_2$–$C_{12}$ alkyiphenyl) silane on the bottom planarizing polymer layer of a bilayer resist or on a substrate. Suitable substrates include silicon, ceramics, glass, quartz or the like. The film can be formed using art known techniques such as spin or spray coating, or doctor blading.

In the second step of the process, the film is imagewise exposed to electromagnetic radiation suitably at a wavelength of about 200 to 500 nm, preferably 200–300 nm.

Suitable radiation sources include various arc lamps such as mercury, deuterium or excimer laser sources. The radiation causes photodegradation of the polysilane into lower molecular weight fragments (often with oxygen incorporation) which are soluble in organic solvents. The poly($C_2$–$C_{12}$ alkylphenyl)silanes used in the process of the present invention degrade more r apidly than prior art polysilanes. Further the polysilanes of the present invention degrade into smaller molecular weight units per absorbed dose than prior art polysilanes and also undergo greater photodegradation per absorbed dose at shorter wavelengths such as deep UV.

The third step involves development of the image. Suitable development can be done with organic solvent mixtures such as toluene-cyclohexanol, t-butylacetate-isopropanol, n-butylacetate-isopropanol and other like mixtures using art known techniques.

A preferred process of the present invention involves a bilayer resist and comprises the steps of (a) coating a substrate with a planarizing polymer layer; (b) coating the polymer layer with a film comprising poly($C_2$–$C_{12}$ alkylphenyl)silane; (c) imagewise exposing the film to radiation (d) developing the image in the film by art known techniques such as by treatment with an organic solvent and (e) transferring the image through the polymer to the substrate by art known techniques such a oxygen plasma development e.g. $O_2$-RIE. Suitable planarizing polymers include hardbaked diazonaphthoquinone novolac, polyimides, polyesters, polyacrylates and the like. It is desired that the imaging layer not admix with the planarizing layer during the coating process.

The present invention also relates to an integrated circuit comprising a circuit made by the steps of (a) forming a film over a non conductive substrate, said film comprising poly ($C_2$–$C_{12}$ alkylphenyl)silane; (b) imagewise exposing the film to radiation; (c) developing the image by art known techniques and (d) forming the circuit in the developed film on the substrate by art known techniques.

In the bilayer resist, the image in the polysilane is transferred through the underlying planarizing polymer layer to the substrate by art known techniques such as oxygen plasma development. After the substrate has been exposed, circuit patterns can be formed in the exposed areas by coating the substrate with a conductive material such as conductive metals by art known techniques such as evaporation, sputtering, chemical vapor deposition or laser induced deposition. Dielectric materials may also be deposited by similar means during the process of making circuits. Inorganic ions such as boron, phosphorous or arsenic can be implanted in the substrate in the process for making p or n doped circuit transitors. Other means for forming circuits will be known by those skilled in the art.

The following examples are detailed descriptions of processes of the present invention. The detailed preparations fall within the scope of, and serve to exemplify, the more generally described processes set forth above. The examples are presented for illustrative purposes only, and are not intended as a restriction on the scope of the invention. All temperatures are in degrees Celsius.

EXAMPLE 1

Synthesis

I. Poly(ethylphenylsilane)—A clean, dry 500 mL flat bottom resin flask equipped with a condenser, argon inlet, addition funnel, and teflon mechanical stirrer was charged with 55 mL toluene and 2.0 g sodium (0.087 mol). The mixture was brought to reflux and stirred at 1800 rpm for 45 minutes producing a fine dispersion. After cooling to room temperature, 25 mL more toluene was added and the mixture heated to 65° in oil bath. A 50% solution (by volume) of 8.7 g ethylphenyldichlorosilane (0.042 mol) in toluene was added dropwise over approx. 10 min. while stirring (600 RPM), producing a viscous, purple reaction mixture. Quenching with isopropanol and work up of the reaction resulted in 1.16 g (20% yield) of a colorless solid, poly (ethylphenylsilane) molecular weight Mw=$9.2 \times 10^5$ Daltons: Anal. Calc'd for $C_8H_{10}Si$: C, 71.57; H, 7.51 Si, 20.92; Found: C 71.47; H, 7.45; Si, 20.91.

Using the above procedure and appropriate starting materials the following polymers were also synthesized:

Poly (n-hexyl-p-methoxyphenylsilane): Yield 18%; Mw=$8.3 \times 10^5$ Daltons: Anal. Calc'd for $C_{13}H_{20}OSi$; C, 70.85, H, 9.15, Si 13.74; Found: C,. 70.89, H, 9.08, Si, 13.70.

Poly (n-hexylphenylsilane): Yield 21%; Mw $2.7 \times 10^6$ Daltons:=Anal. Calc'd for $C_{12}H_{19}Si$: C, 75.32; H, 10.01; Si, 14.68., found C, 75.25; H, 9.83; Si, 14.68.

Poly(ethyl-p-methoxyphenylsilane): Yield 18%; Mw=$1.5 \times 10^6$ Daltons: Anal. Calc'd for $C_9H_{12}OSi$: C, 65.80; H, 7.36; Si, 17.10. Found: C, 66.33; H, 7.32; Si, 17.05.

Poly(ethyl-p-t-butylphenylsilane): Mw=$1.02 \times 10^6$ Daltons; Yield 25%; Mw=Anal. Calc'd for $C_{12}H_{18}Si$: C, 75.71; H, 9.53; Si, 14.75; Found: C, 75.75; H, 8.94; Si, 14.31.

EXAMPLE 2

Bleaching Studies

I. Films of polysilane (0.2–0.5 microns) were spin coated onto a quartz substrate. The films were irradiated with a range of 5 to 60 millijoules/$cm^2$ of 254 nm radiation and the absorbance was measured at the wavelength $\lambda$ max by a diode array UV-Vis spectrophotometer. The results were as follows:

| Incident Dose (mJ/$cm^2$) | Normalized Polymer* Absorption at $\lambda_{max}$ | | | |
|---|---|---|---|---|
| | #1 | #2 | #3 | #4 |
| 0 | 100 | 100 | 100 | 100 |
| 5 | 98 | 87 | 90 | 77 |
| 10 | 94 | 75 | 80 | 54 |
| 20 | 87 | 54 | 57 | 30 |
| 30 | 80 | 42 | 42 | 22 |
| 40 | 76 | 32 | 28 | 15 |
| 60 | 64 | 19 | 12 | — |

*1. poly (methylphenylsilane) - prior art
2. poly (ethylphenylsilane) -
3. poly (hexylphenylsilane)
4. poly (ethyl-p-tert-butyl) phenyl silane II. Films of polymethylphenylsilane PMPS and poly (ethyl-t-butylphenyl) PEBPS silane were spin coated onto a silicon wafer. The films were then exposed to varying doses of radiation at 254 nm and developed by immersion in a mixture of t-butylacetate/isopropyl alcohol optimized for development of the specific polymer. The degree of degradation as measured by the normalized film thickness remaining was plotted as a log function of the dose to provide sensitivity contrast curves of FIG. 1.

Although this invention has been described with respect to specific embodiments, the details thereof are not to be construed as limitations for it will be apparent that various embodiments, changes and modifications may be resorted to without departing from the spirit and scope thereof, and it is understood that such equivalent embodiments are intended to be included within the scope of this invention.

We claim:

1. A process for generating a positive tone resist image in a film of poly($C_2$–$C_{12}$ alkylphenyl)silane comprising the steps of (a) forming a film of poly($C_2$-$C_{12}$ alkylphenyl)silane; (b) imagewise exposing the film to radiation at a wavelength of about 200 to 500 nm and (c) developing the image.

2. The process of claim 1 wherein said film is poly($C_2$–$C_8$ alkylphenyl)silane.

3. The process of claim 2 wherein said film is poly(ethylphenyl)silane.

4. The process of claim 2 wherein said film is poly(hexylphenyl)silane.

5. The process of claim 2 wherein said film is poly(ethyl-t-butylphenyl)silane.

6. The process of claim 1 wherein said film further comprises a sensitizer.

* * * * *